US010097177B2

(12) United States Patent
Tsai et al.

(10) Patent No.: US 10,097,177 B2
(45) Date of Patent: Oct. 9, 2018

(54) SWITCH DEVICE, CONTROL METHOD OF THE SAME, AND CONTROL METHOD OF TRANSFER SWITCH SYSTEM USING THE SAME

(71) Applicants: LITE-ON ELECTRONICS (GUANGZHOU) LIMITED, Guangzhou (CN); LITE-ON TECHNOLOGY CORP., Taipei (TW)

(72) Inventors: Wen-Che Tsai, Taipei (TW); Shih-Ming Chen, Taipei (TW); Yong-Long Lee, Taipei (TW); Jin-Yuan Lai, Taipei (TW)

(73) Assignees: Lite-On Electronics (Guangzhou) Limited, Guangzhou (CN); Lite-On Technology Corp., Taipei (TW)

(*) Notice: Subject to any disclaimer, the term of this patent is extended or adjusted under 35 U.S.C. 154(b) by 67 days.

(21) Appl. No.: 15/262,188

(22) Filed: Sep. 12, 2016

(65) Prior Publication Data
US 2017/0359061 A1    Dec. 14, 2017

(30) Foreign Application Priority Data

Jun. 8, 2016    (CN) .......................... 2016 1 0404284

(51) Int. Cl.
| H03K 17/687 | (2006.01) |
| H03K 17/567 | (2006.01) |
| H02J 9/06 | (2006.01) |
| H03K 17/12 | (2006.01) |
| H03K 17/693 | (2006.01) |
| H03K 17/73 | (2006.01) |
| H01H 71/12 | (2006.01) |
| H03K 17/51 | (2006.01) |

(52) U.S. Cl.
CPC .......... *H03K 17/6871* (2013.01); *H02J 9/061* (2013.01); *H03K 17/122* (2013.01); *H03K 17/125* (2013.01); *H03K 17/567* (2013.01); *H03K 17/693* (2013.01); *H03K 17/73* (2013.01); *H01H 2071/124* (2013.01); *H03K 2017/515* (2013.01); *H03K 2217/0009* (2013.01)

(58) Field of Classification Search
CPC ........... H03K 17/567; H03K 17/04123; H03K 17/72; H03K 17/725; G05D 22/02
USPC ........................................ 327/427, 428, 434
See application file for complete search history.

(56) References Cited

U.S. PATENT DOCUMENTS 4,338,549 A * 7/1982 Haferl .................... H03K 4/625
315/393
5,889,374 A * 3/1999 Pezzani ................. H01L 29/747
318/400.09

(Continued)

*Primary Examiner* — Anh Q Tra
(74) *Attorney, Agent, or Firm* — Rosenberg, Klein & Lee

(57) ABSTRACT

A switch device includes first and second switch units that are coupled respectively to first and second output terminals. Each of the first and second switch units includes a plurality of diodes and at least one semiconductor-controlled rectifier (SCR), where at least one of the diodes and one of the at least one SCR cooperatively permit a current to flow therethrough to a corresponding one of the first and second output terminals when each thereof operates in an ON state, and where at least one of the diodes and one of the at least one SCR cooperatively permit a current to flow therethrough from a corresponding one of the first and second output terminals when each thereof operates in an ON state.

16 Claims, 9 Drawing Sheets

(56) References Cited

U.S. PATENT DOCUMENTS

| | | | | |
|---|---|---|---|---|
| 7,068,008 B2* | 6/2006 | Marioni | .............. | F04D 15/0066 |
| | | | | 318/700 |
| 7,626,840 B2* | 12/2009 | Ueda | .................... | H02M 5/293 |
| | | | | 363/163 |
| 9,344,082 B2* | 5/2016 | Shen | ....................... | H03K 17/73 |
| 2008/0106833 A1* | 5/2008 | Lewinski | ............... | H02H 3/335 |
| | | | | 361/49 |
| 2013/0235492 A1* | 9/2013 | Zhou | ..................... | H02H 7/065 |
| | | | | 361/18 |
| 2014/0239343 A1* | 8/2014 | Di Sarro | .......... | H01L 29/66121 |
| | | | | 257/121 |
| 2014/0368173 A1* | 12/2014 | Banno | ................ | H02M 5/2573 |
| | | | | 323/235 |
| 2015/0109837 A1* | 4/2015 | Pan | ........................ | H02M 7/06 |
| | | | | 363/126 |
| 2016/0233720 A1* | 8/2016 | Lee | .......................... | G06F 1/30 |
| 2016/0344384 A1* | 11/2016 | Hague | ................ | H01L 29/7408 |

* cited by examiner

SWITCH DEVICE, CONTROL METHOD OF THE SAME, AND CONTROL METHOD OF TRANSFER SWITCH SYSTEM USING THE SAME

CROSS-REFERENCE TO RELATED APPLICATION

This application claims priority of Chinese Patent Application No. 201610404284.X, filed on Jun. 8, 2016.

FIELD

The disclosure relates to transfer switch techniques, and more particularly to a switch device, a control method of the same, and a control method of a transfer switch system using the same.

BACKGROUND

A conventional switch device receives power from a power source, and is switchable between outputting and not outputting the received power to a load. A conventional transfer switch system includes a plurality of such conventional switch devices, each of which receives power from a respective power source. These conventional switch devices are controlled in such a way that one of the conventional switch devices outputs the power received thereby to power a load. When a primary one of the power sources (e.g., a grid power source) that currently powers the load through the conventional transfer switch system becomes abnormal (e.g., when a brownout condition or a dropout condition is encountered), the conventional transfer switch system is controlled such that a backup one of the power sources (e.g., an uninterruptible power supply) powers the load through the conventional transfer switch system instead.

For the conventional transfer switch system, each conventional switch device induces a relatively large transient current when switching between outputting and not outputting the received power to the load. Under a circumstance where each conventional switch device includes a relay, electrical contacts of the relay are easily welded to each other due to the relatively large transient current, and as a result, the conventional switch device cannot operate normally and thus has poor reliability.

SUMMARY

Therefore, an object of the disclosure is to provide a switch device that can alleviate the drawback of the prior art, a control method of the same, and a control method of a transfer switch system using the same.

According to one aspect of the disclosure, the switch device includes a first input terminal, a second input terminal, a first output terminal, a second output terminal, a first switch unit and a second switch unit. The first switch unit is coupled between the first input terminal and the first output terminal. The second switch unit is coupled between the second input terminal and the second output terminal. Each of the first and second switch units includes a plurality of diodes and at least one semiconductor-controlled rectifier (SCR), where at least one of the diodes and one of the at least one SCR cooperatively permit a current to flow therethrough from the corresponding one of the first and second input terminals to the corresponding one of the first and second output terminals when each thereof operates in an ON state, and where at least one of the diodes and one of the at least one SCR cooperatively permit a current to flow therethrough from the corresponding one of the first and second output terminals to the corresponding one of the first and second input terminals when each thereof operates in an ON state.

In one embodiment, each of the first and second switch units further includes a first relay that is coupled between the first input terminal and the first switch unit, a second relay that is coupled between the second input terminal and the second switch unit, and a third relay that is coupled between the corresponding one of the first and second relays and the corresponding one of the first and second output terminals.

According to another aspect of the disclosure, there is provided the control method for controlling a switch device according to said one embodiment. The first and second input terminals of the switch device are coupled to an alternating current (AC) power source for receiving an AC voltage therefrom. The control method includes a procedure that is performed when the AC voltage has an amplitude which equals a predetermined value greater than zero, and that includes the steps of: at a first time point, controlling each of the first and second relays to transition from an OFF state to an ON state; at a second time point after the first time point, controlling the at least one SCR of each of the first and second switch units to be operable between an ON state and an OFF state based on a voltage thereacross; at a third time point after the second time point, controlling the third relay of each of the first and second switch units to transition from an OFF state to an ON state; and at a fourth time point after the third time point, controlling the at least one SCR of each of the first and second switch units to disable transitioning of the at least one SCR from the OFF state to the ON state.

According to yet another aspect of the disclosure, there is provided the control method for controlling a transfer switch system that includes a first switch device and a second switch device. Each of the first and second switch devices is a switch device according to said one embodiment. The first and second input terminals of the first switch device are coupled to a first alternating current (AC) power source for receiving a first AC voltage therefrom. The first and second input terminals of the second switch device are coupled to a second AC power source for receiving a second AC voltage therefrom. The first and second output terminals of the second switch device are coupled respectively to the first and second output terminals of the first switch device. The control method includes a procedure that is performed when the first AC voltage has an amplitude which equals a predetermined value greater than zero, and that includes the steps of: at a first time point, controlling each of the first and second relays of the first switch device to transition from an OFF state to an ON state; at a second time point after the first time point, controlling the at least one SCR of each of the first and second switch units of the second switch device to be operable between an ON state and an OFF state based on a voltage thereacross; at a third time point after the second time point, controlling the third relay of each of the first and second switch units of the second switch device to transition from an ON state to an OFF state; at a fourth time point after the third time point, controlling the at least one SCR of each of the first and second switch units of the second switch device to disable transitioning of the at least one SCR from the OFF state to the ON state; at a fifth time point after the fourth time point, controlling the at least one SCR of each of the first and second switch units of the first switch device to be operable between an ON state and an OFF state based on a voltage thereacross; at a sixth time point after the fifth time point, controlling the third relay of each of the first and second switch units of the first switch device to transition from an OFF state to an ON state; and at a seventh time point after the sixth time point, controlling the at least one SCR of each of the first and second switch units of the first switch device to disable transitioning of the at least one SCR from the OFF state to the ON state.

BRIEF DESCRIPTION OF THE DRAWINGS

Other features and advantages of the disclosure will become apparent in the following detailed description of the embodiment (s) with reference to the accompanying drawings, of which.

DETAILED DESCRIPTION

Figure 1:
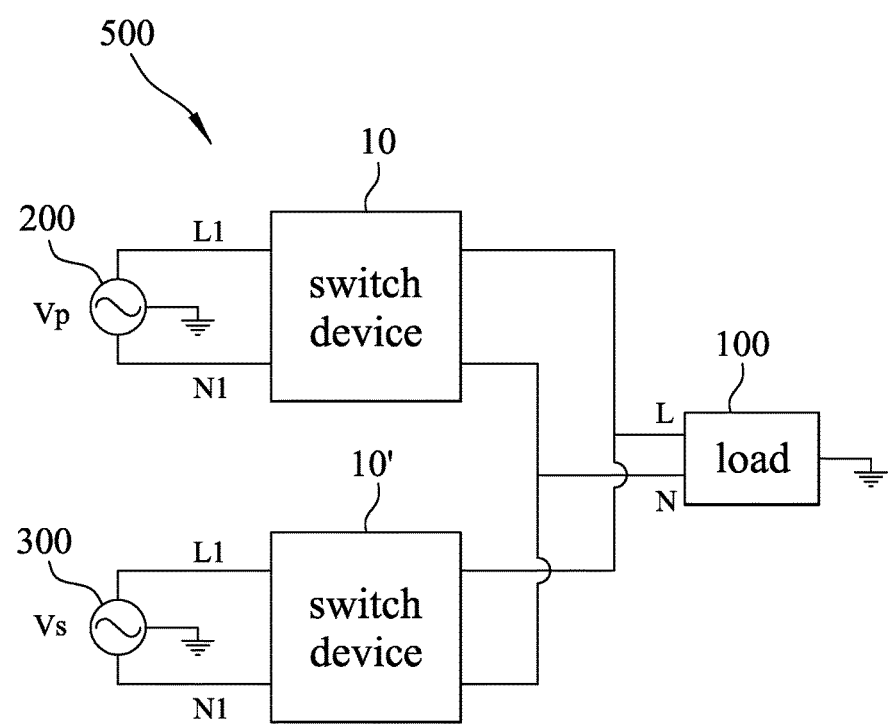
FIG. 1 is a block diagram illustrating a first embodiment of a transfer switch system in use with a first AC power source according to the disclosure.

Before the disclosure is described in greater detail, it should be noted that where considered appropriate, reference numerals or terminal portions of reference numerals have been repeated among the figures to indicate corresponding or analogous elements, which may optionally have similar characteristics.

Referring to FIG. 1, a first embodiment of a transfer switch system 500 according to the disclosure includes a first switch device 10 and a second switch device 10'.

The first switch device 10 is used to be coupled to a load 100 and a first alternating current (AC) power source 200 that provides a first AC voltage (Vp). The second switch device 10' is used to be coupled to the load 100 and a second AC power source 300 that provides a second AC voltage (Vs). Each of the first and second AC power sources 200, 300 and the load 100 has a live terminal (L1, L) and a neutral terminal (N1, N).

Figure 2:
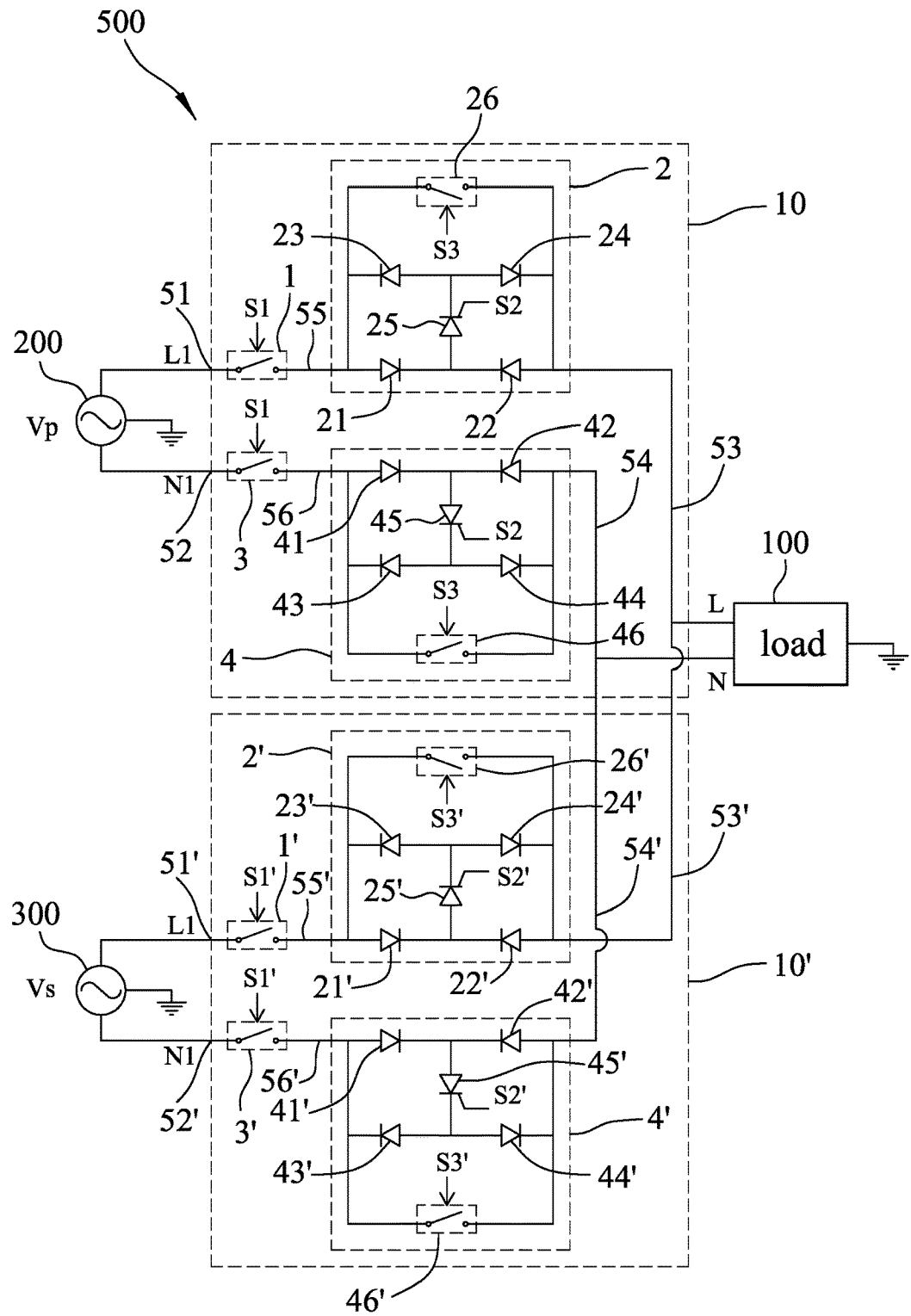
FIG. 2 is a circuit diagram illustrating the first embodiment.

Referring to FIG. 2, each of the first and second switch devices 10, 10' includes a first input terminal 51, 51', a second input terminal 52, 52', a first output terminal 53, 53', a second output terminal 54, 54', a first internal node 55, 55', a second internal node 56, 56', a first relay 1, 1', a second relay 3, 3', a first switch unit 2, 2' and a second switch unit 4, 4'.

The first and second input terminals 51, 52 of the first switch device 10 are used to be coupled respectively to the live and neutral terminals (L1, N1) of the first AC power source 200 for cooperatively receiving the first AC voltage (Vp) therefrom. The first and second output terminals 53, 54 of the first switch device 10 are used to be coupled respectively to the live and neutral terminals (L, N) of the load 100. The first and second input terminals 51', 52' of the second switch device 10' are used to be coupled respectively to the live and neutral terminals (L1, N1) of the second AC power source 300 for cooperatively receiving the second AC voltage (Vs) therefrom. The first and second output terminals 53', 54' of the second switch device 10' are coupled respectively to the first and second output terminals 53, 54 of the first switch device 10.

It is noted that, in this embodiment, the first and second switch devices 10, 10' have the same configuration, and therefore only the first switch device 10 is exemplarily described hereinafter for the sake of brevity.

The first relay 1 is coupled between the first input terminal 51 and the first internal node 55. The second relay 3 is coupled between the second input terminal 52 and the second internal node 56. The first switch unit 2 is coupled between the first internal node 55 and the first output terminal 53. The second switch unit 4 is coupled between the second internal node 56 and the second output terminal 54.

In this embodiment, each of the first and second switch units 2, 4 includes four diodes 21-24, 41-44, a semiconductor-controlled rectifier (SCR) 25, 45 and a third relay 26, 46, where the diodes 21-24, 41-44 include a first diode 21, 41, a second diode 22, 42, a third diode 23, 43 and a fourth diode 24, 44. For each of the first and second switch units 2, 4, the first diode 21, 41 has an anode that is coupled to a corresponding one of the first and second internal nodes 55, 56, and a cathode; the second diode 22, 42 has an anode that is coupled to a corresponding one of the first and second output terminals 53, 54, and a cathode that is coupled to the cathode of the first diode 21, 41; the third diode 23, 43 has an anode, and a cathode that is coupled to the anode of the first diode 21, 41; the fourth diode 24, 44 has an anode that is coupled to the anode of the third diode 23, 43, and a cathode that is coupled to the anode of the second diode 22, 42; the SCR 25, 45 has an anode that is coupled to the cathode of the first diode 21, 41, and a cathode that is coupled to the anode of the third diode 23, 43; and the third relay 26, 46 is coupled between the anode of the first diode 21, 41 and the anode of the second diode 22, 42. The first diode 21, 41, the SCR 25, 45 and the fourth diode 24, 44 cooperatively permit a current to flow therethrough from the corresponding one of the first and second internal nodes 55, 56 to the corresponding one of the first and second output terminals 53, 54 when each thereof operates in an ON state. The second diode 22, 42, the SCR 25, 45 and the third diode 23, 43 cooperatively permit a current to flow therethrough from the corresponding one of the first and second output terminals 53, 54 to the corresponding one of the first and second internal nodes 55, 56 when each thereof operates in an ON state.

Each of the first, second and third relays 1, 1', 3, 3', 26, 26', 46, 46' and the SCRs 25, 25', 45, 45' is operable between an ON state and an OFF state. Each of the first and second relays 1, 3 is used to be controlled by a controller (not shown) via a first control signal (S1). Each of the SCRs 25, 45 is used to be controlled by the controller via a second control signal (S2). Each of the third relays 26, 46 is used to be controlled by the controller via a third control signal (S3). Each of the first and second relays 1', 3' is used to be controlled by the controller via a fourth control signal (S1').

Each of the SCRs 25', 45' is used to be controlled by the controller via a fifth control signal (S2'). Each of the third relays 26', 46' is used to be controlled by the controller via a sixth control signal (S3').

Figure 3:
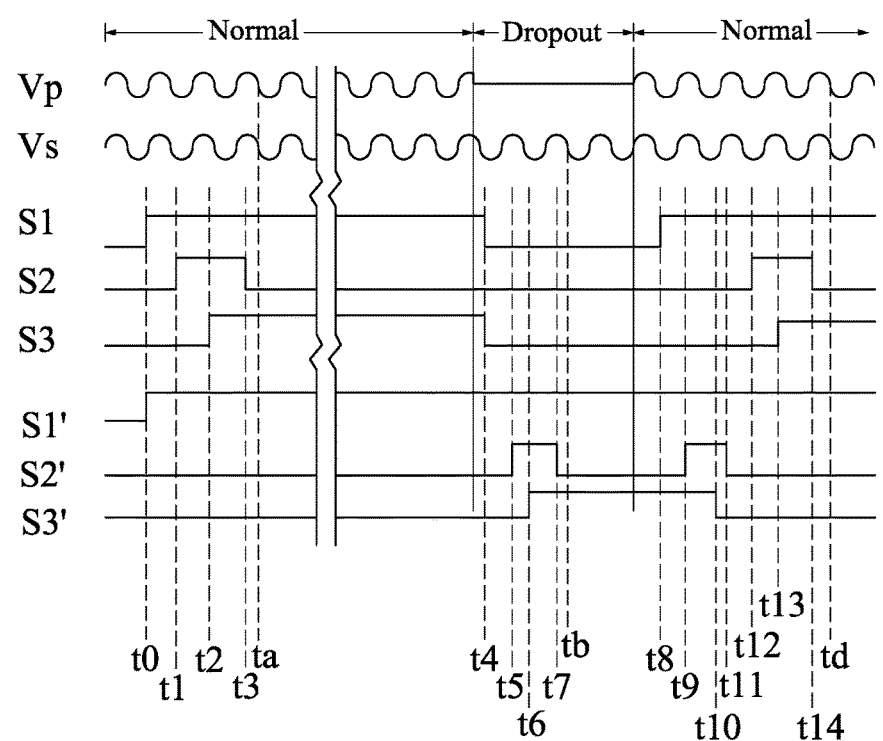
FIG. 3 is a timing diagram illustrating operation of the first embodiment when the first AC power source is in a normal condition and in a dropout condition.
Figure 4:
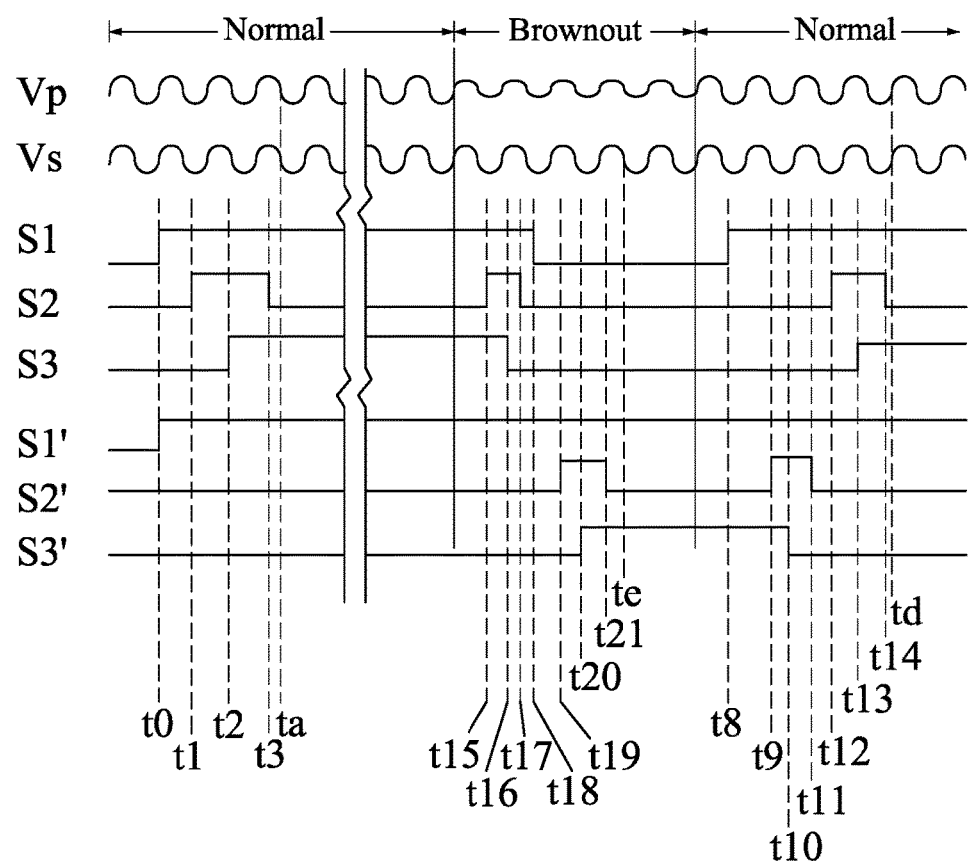
FIG. 4 is a timing diagram illustrating operation of the first embodiment when the first AC power source is in the normal condition and in a brownout condition.

Referring to FIGS. 2 to 4, operation of the transfer switch system 500 of this embodiment under the control of the controller is described below.

Referring to FIGS. 2 and 3, first, when the first AC power source 200 is in a normal condition, i.e., the first AC voltage (Vp) has an amplitude (e.g., a peak amplitude) that equals a predetermined value which is greater than zero, each of the first, second and third relays 1, 1', 3, 3', 26, 26', 46, 46' and the SCRs 25, 25', 45, 45' is controlled by the controller to initially operate in the OFF state such that none of the first and second AC power sources 200, 300 powers the load 100 through the transfer switch system 500 of this embodiment, and then a startup procedure that includes the following steps is executed by the controller such that the first AC power source 200 powers the load 100 through the transfer switch system 500 of this embodiment.

At a first time point (t0) as shown in FIG. 3, each of the first and second relays 1, 1', 3, 3' is controlled to transition from the OFF state to the ON state.

At a second time point (t1) after the first time point (t0), each of the SCRs 25, 45 is controlled to be operable between the ON state and the OFF state based on a voltage thereacross.

At a third time point (t2) after the second time point (t1), each of the third relays 26, 46 is controlled to transition from the OFF state to the ON state.

At a fourth time point (t3) after the third time point (t2), transitioning of each of the SCRs 25, 45 from the OFF state to the ON state is disabled.

During a time period from the second time point (t1) to the third time point (t2), the first AC power source 200 provides a current that flows from the first input terminal 51 to the second input terminal 52 through the first relay 1, the series-connected elements 21, 25, 24, the load 100, the series-connected elements 42, 45, 43 and the second relay 3 in a positive half cycle of the first AC voltage (Vp), and that flows from the second input terminal 52 to the first input terminal 51 through the second relay 3, the series-connected elements 41, 45, 44, the load 100, the series-connected elements 22, 25, 23 and the first relay 1 in a negative half cycle of the first AC voltage (Vp).

During a time period from the third time point (t2) to a time point (ta) which is not before the fourth time point (t3) and at which each of the SCRs 25, 45 transitions from the ON state to the OFF state, the current provided by the first AC power source 200 flows from the first input terminal 51 to the second input terminal 52 through the first relay 1, the parallel connection of the third relay 26 and the series-connected elements 21, 25, 24, the load 100, the parallel connection of the third relay 46 and the series-connected elements 42, 45, 43, and the second relay 3 in the positive half cycle of the first AC voltage (Vp), and flows from the second input terminal 52 to the first input terminal 51 through the second relay 3, the parallel connection of the third relay 46 and the series-connected elements 41, 45, 44, the load 100, the parallel connection of the third relay 26 and the series-connected elements 22, 25, 23, and the first relay 1 in the negative half cycle of the first AC voltage (Vp).

After the time point (ta), the current provided by the first AC power source 200 flows from the first input terminal 51 to the second input terminal 52 through the first relay 1, the third relay 26, the load 100, the third relay 46 and the second relay 3 in the positive half cycle of the first AC voltage (Vp), and flows from the second input terminal 52 to the first input terminal 51 through the second relay 3, the third relay 46, the load 100, the third relay 26 and the first relay 1 in the negative half cycle of the first AC voltage (Vp).

As a result, since each of the first to fourth diodes 21-24, 41-44 and the SCRs 25, 45 has a relatively large ON resistance, the first switch device 10 induces a relatively small transient current when the first AC power source 200 starts to power the load 100 through the first switch device 10 due to the control at the second time point (t1). Since each of the third relays 26, 46 has a relatively small ON resistance, and since each of the first to fourth diodes 21-24, 41-44 and the SCRs 25, 45 operates in the OFF state after the time point (ta), each of the first to fourth diodes 21-24, 41-44 and the SCRs 25, 45 has relatively small conduction loss during the time period from the third time point (t2) to the time point (ta), and has no conduction loss after the time point (ta). Accordingly, the first switch device 10 has relatively low power loss during the time period from the third time point (t2) to the time point (ta), and has even lower power loss after the time point (ta).

Next, when the first AC power source 200 is in a dropout condition (i.e., the amplitude of the first AC voltage (Vp) equals zero), a first procedure that includes the following steps is executed by the controller such that the second AC power source 300 powers the load 100 through the transfer switch system 500 of this embodiment.

At a fifth time point (t4), each of the first, second and third relays 1, 3, 26, 46 is controlled to transition from the ON state to the OFF state.

At a sixth time point (t5) after the fifth time point (t4), each of the SCRs 25', 45' is controlled to be operable between the ON state and the OFF state based on a voltage thereacross.

At a seventh time point (t6) after the sixth time point (t5), each of the third relays 26', 46' is controlled to transition from the OFF state to the ON state.

At an eighth time point (t7) after the seventh time point (t6), transitioning of each of the SCRs 25', 45' from the OFF state to the ON state is disabled.

During a time period from the sixth time point (t5) to the seventh time point (t6), the second AC power source 300 provides a current that flows from the first input terminal 51' to the second input terminal 52' through the first relay 1', the series-connected elements 21', 25', 24', the load 100, the series-connected elements 42', 45', 43' and the second relay 3' in a positive half cycle of the second AC voltage (Vs), and that flows from the second input terminal 52' to the first input terminal 51' through the second relay 3', the series-connected elements 41', 45', 44', the load 100, the series-connected elements 22', 25', 23' and the first relay 1' in a negative half cycle of the second AC voltage (Vs).

During a time period from the seventh time point (t6) to a time point (tb) which is not before the eighth time point (t7) and at which each of the SCRs 25', 45' transitions from the ON state to the OFF state, the current provided by the second AC power source 300 flows from the first input terminal 51' to the second input terminal 52' through the first relay 1', the parallel connection of the third relay 26' and the series-connected elements 21', 25', 24', the load 100, the parallel connection of the third relay 46' and the series-connected elements 42', 45', 43', and the second relay 3' in the positive half cycle of the second AC voltage (Vs), and flows from the second input terminal 52' to the first input terminal 51' through the second relay 3', the parallel connection of the third relay 46' and the series-connected elements 41', 45', 44', the load 100, the parallel connection of the third relay 26' and the series-connected elements 22', 25', 23', and the first relay 1' in the negative half cycle of the second AC voltage (Vs).

After the time point (tb), the current provided by the second AC power source 300 flows from the first input terminal 51' to the second input terminal 52' through the first relay 1', the third relay 26', the load 100, the third relay 46' and the second relay 3' in the positive half cycle of the second AC voltage (Vs), and flows from the second input terminal 52' to the first input terminal 51' through the second relay 3', the third relay 46', the load 100, the third relay 26' and the first relay 1' in the negative half cycle of the second AC voltage (Vs).

As a result, since each of the first and second relays 1, 3 operates in the OFF state after the fifth time point (t4), backfeeding into the first AC power source 200 is prevented. Since each of the first to fourth diodes 21'-24', 41'-44' and the SCRs 25', 45' has a relatively large ON resistance, the second switch device 10' induces a relatively small transient current when the second AC power source 300 starts to power the load 100 through the second switch device 10' due to the control at the sixth time point (t5). Since each of the third relays 26', 46' has a relatively small ON resistance, and since each of the first to fourth diodes 21'-24', 41'-44' and the SCRs 25', 45' operates in the OFF state after the time point (tb), each of the first to fourth diodes 21'-24', 41'-44' and the SCRs 25', 45' has relatively small conduction loss during the time period from the seventh time point (t6) to the time point (tb), and has no conduction loss after the time point (tb). Accordingly, the second switch device 10' has relatively low power loss during the time period from the seventh time point (t6) to the time point (tb), and has even lower power loss after the time point (tb).

Next, when the first AC power source 200 is in the normal condition again, a second procedure that includes the following steps is executed by the controller such that the first AC power source 200 powers the load 100 through the transfer switch system 500 of this embodiment again.

At a ninth time point (t8), each of the first and second relays 1, 3 is controlled to transition from the OFF state to the ON state.

At a tenth time point (t9) after the ninth time point (t8), each of the SCRs 25', 45' is controlled to be operable between the ON state and the OFF state based on the voltage thereacross.

At an eleventh time point (t10) after the tenth time point (t9), each of the third relay 26', 46' is controlled to transition from the ON state to the OFF state.

At a twelfth time point (t11) after the eleventh time point (t10), transitioning of each of the SCRs 25', 45' from the OFF state to the ON state is disabled.

At a thirteenth time point (t12) after the twelfth time point (t11), each of the SCRs 25, 45 is controlled to be operable between the ON state and the OFF state based on the voltage thereacross.

At a fourteenth time point (t13) after the thirteenth time point (t12), each of the third relays 26, 46 is controlled to transition from the OFF state to the ON state.

At a fifteenth time point (t14) after the fourteenth time point (t13), transitioning of each of the SCRs 25, 45 from the OFF state to the ON state is disabled.

As a result, since the ON resistance of each of the first to fourth diodes 21'-24', 41'-44' and the SCRs 25', 45' is relatively large, the second switch device 10' induces a relatively small transient current when the second AC power source 300 stops powering the load 100 through the second switch device 10' due to the control at the twelfth time point (t11). Since the ON resistance of each of the first to fourth diodes 21-24, 41-44 and the SCRs 25, 45 is relatively large, the first switch device 10 induces a relatively small transient current when the first AC power source 200 starts to power the load 100 through the first switch device 10 due to the control at the thirteenth time point (t12). Since the ON resistance of each of the third relays 26, 46 is relatively small, and since each of the first to fourth diodes 21-24, 41-44 and the SCRs 25, 45 operates in the OFF state after a time point (td) which is not before the fifteenth time point (t14) and at which each of the SCRs 25, 45 transitions from the ON state to the OFF state, the conduction loss of each of the first to fourth diodes 21-24, 41-44 and the SCRs 25, 45 is relatively small during a time period from the fourteenth time point (t13) to the time point (td), and is zero (i.e., no conduction loss) after the time point (td). Accordingly, the power loss of the first switch device 10 is relatively low during the time period from the fourteenth time point (t13) to the time point (td), and is even lower after the time point (td).

Referring to FIGS. 2 and 4, when the first AC power source 200 is in a brownout condition (i.e., the amplitude of the first AC voltage (Vp) is greater than zero but less than the predetermined value), a third procedure that includes the following steps is executed by the controller such that the second AC power source 300 powers the load 100 through the transfer switch system 500 of this embodiment.

At a sixteenth time point (t15), each of the SCRs 25, 45 is controlled to be operable between the ON state and the OFF state based on the voltage thereacross.

At a seventeenth time point (t16) after the sixteenth time point (t15), each of the third relays 26, 46 is controlled to transition from the ON state to the OFF state.

At an eighteenth time point (t17) after the seventeenth time point (t16), transitioning of each of the SCRs 25, 45 from the OFF state to the ON state is disabled.

At a nineteenth time point (t18) after the eighteenth time point (t17), each of the first and second relays 1, 3 is controlled to transition from the ON state to the OFF state.

At a twentieth time point (t19) after the nineteenth time point (t18), each of the SCRs 25', 45' is controlled to be operable between the ON state and the OFF state based on the voltage thereacross.

At a twenty-first time point (t20) after the twentieth time point (t19), each of the third relays 26', 46' is controlled to transition from the OFF state to the ON state.

At a twenty-second time point (t21) after the twenty-first time point (t20), transitioning of each of the SCRs 25', 45' from the OFF state to the ON state is disabled.

As a result, since the ON resistance of each of the first to fourth diodes 21-24, 41-44 and the SCRs 25, 45 is relatively large, the first switch device 10 induces a relatively small transient current when the first AC power source 200 stops powering the load 100 through the first switch device 10 due to the control at the eighteenth time point (t17). Since each of the first and second relays 1, 3 operates in the OFF state after the nineteenth time point (t18), backfeeding into the first AC power source 200 is prevented. Since the ON resistance of each of the first to fourth diodes 21'-24', 41'-44' and the SCRs 25', 45' is relatively large, the second switch device 10' induces a relatively small transient current when the second AC power source 300 starts to power the load 100 through the second switch device 10' due to the control at the twentieth time point (t19). Since the ON resistance of each of the third relays 26', 46' is relatively small, and since each of the first to fourth diodes 21'-24', 41'-44' and the SCRs 25', 45' operates in the OFF state after a time point (te) which is not before the twenty-second time point (t21) and at which each of the SCRs 25', 45' transitions from the ON state to the OFF state, the conduction loss of each of the first to fourth diodes 21'-24', 41'-44' and the SCRs 25', 45' is relatively small during a time period from the twenty-first time point (t20) to the time point (te), and is zero (i.e., no conduction loss) after the time point (te). Accordingly, the power loss of the second switch device 10' is relatively low during the time period from the twenty-first time point (t20) to the time point (te), and is even lower after the time point (te).

In view of the above, the transfer switch system 500 of this embodiment has the following advantages:

1. By virtue of the first to fourth diodes 21-24, 21'-24', 41-44, 41'-44' and the SCRs 25, 25', 45, 45', the transient current induced by each of the first and second switch devices 10, 10' can be relatively small. Therefore, welding of each of the first to third relays 1, 1', 3, 3', 26, 26', 46, 46' due to the corresponding transient current can be prevented, resulting in relatively high reliability of each of the first and second switch devices 10, 10'.

2. By virtue of the third relays 26, 26', 46, 46', the power loss of each of the first and second switch devices 10, 10' can be relatively small. Therefore, each of the first and second switch devices 10, 10' has relatively high power efficiency, and a cooling fan may not be required.

3. Since an SCR is relatively expensive, and since a relative small number of SCRs (i.e., two SCRs 25, 25', 45, 45') are required in each of the first and second switch devices 10, 10', so that each of the first and second switch devices 10, 10' has relatively low production costs.

Figure 5:
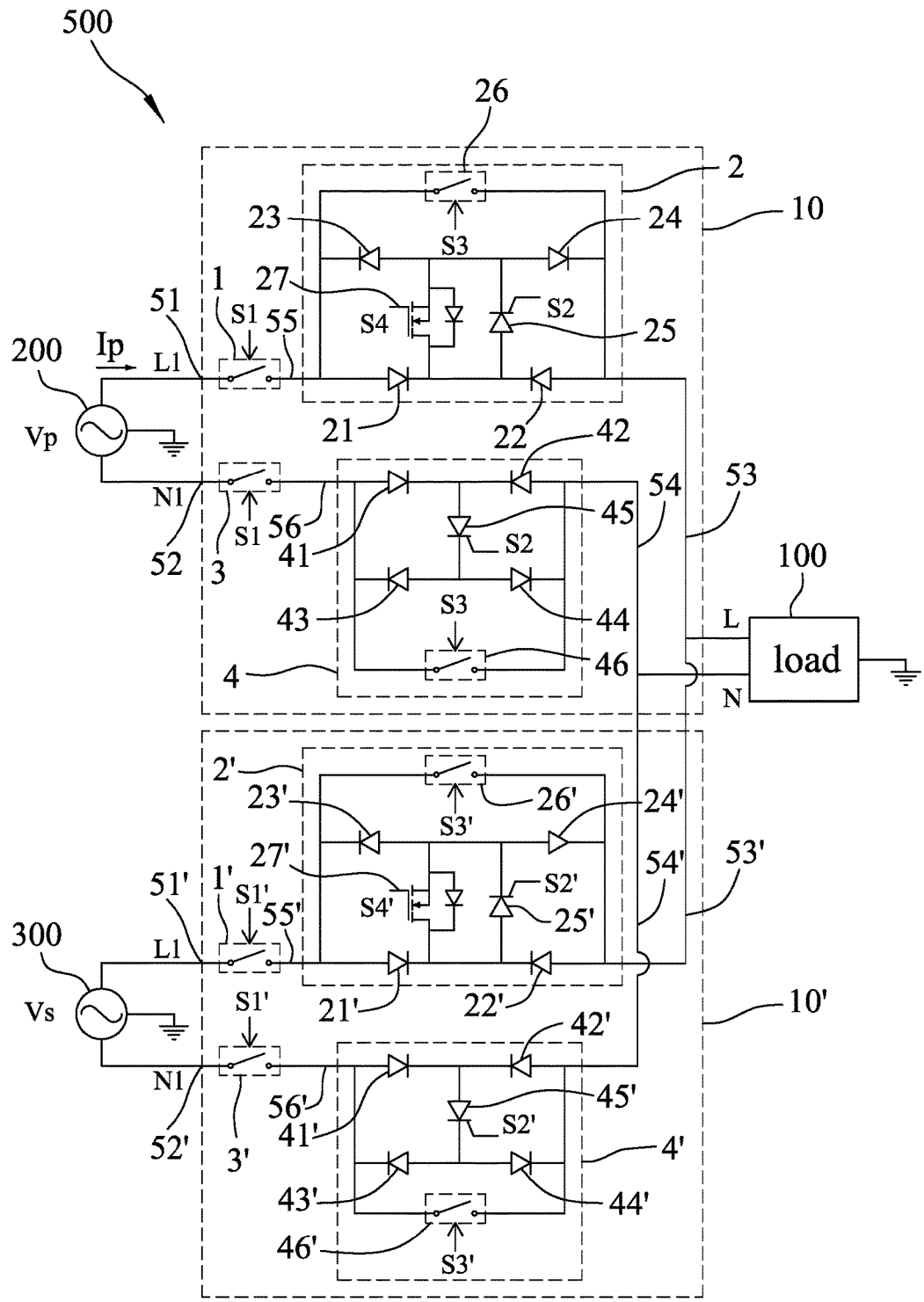
FIG. 5 is a circuit diagram illustrating a second embodiment of the transfer switch system in use with the first AC power source according to the disclosure.
Figure 6:
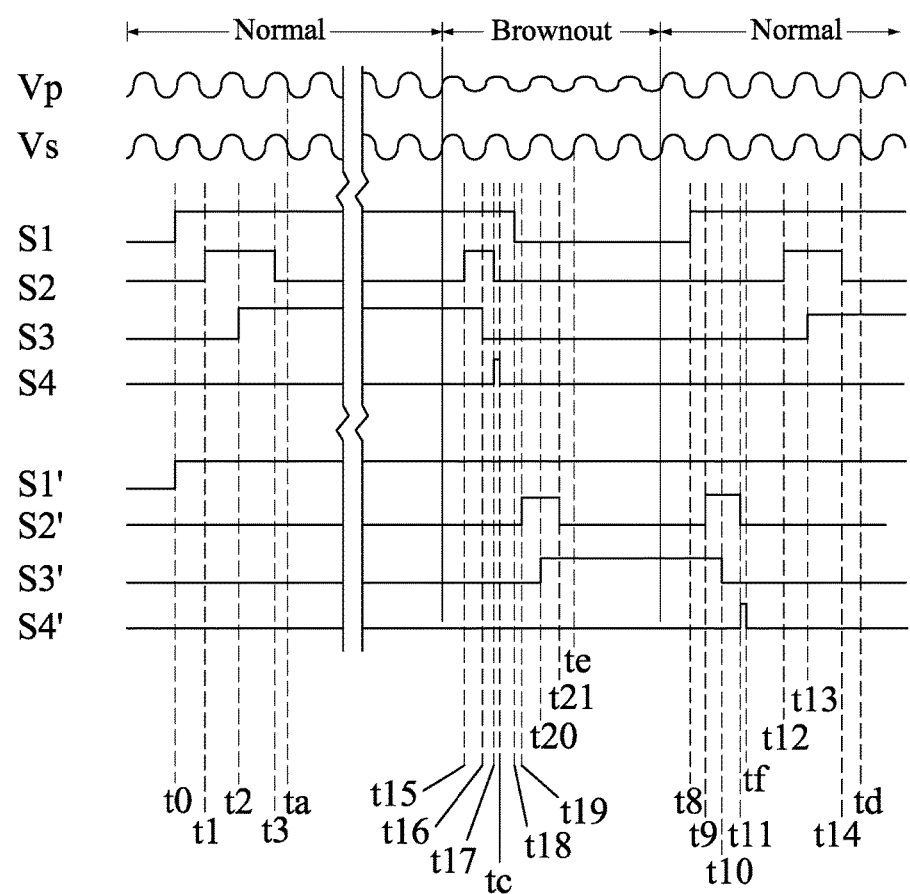
FIG. 6 is a timing diagram illustrating operation of the second embodiment when the first AC power source is in the normal condition and in the brownout condition.
Figure 7:
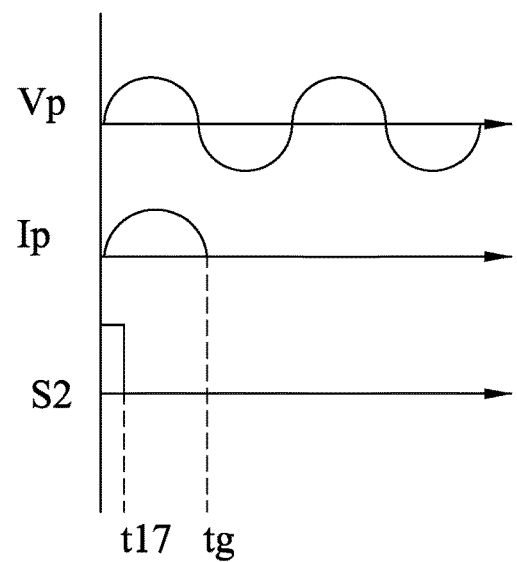
FIG. 7 is a timing diagram illustrating operation of a semiconductor-controlled rectifier (SCR) of the first embodiment.
Figure 8:
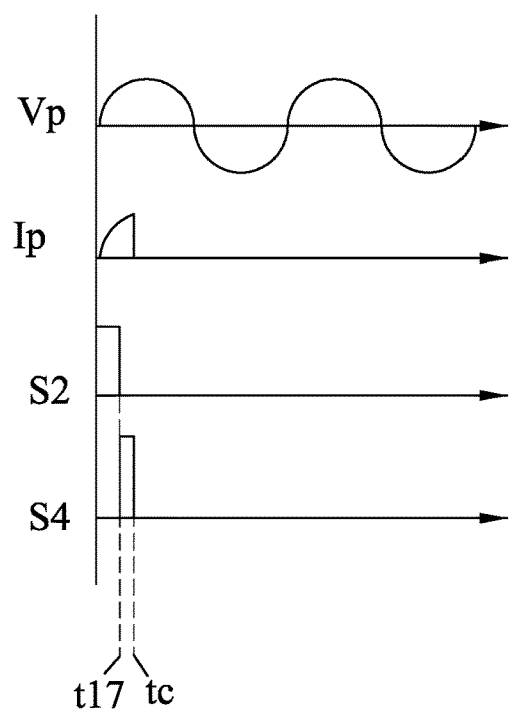
FIG. 8 is a timing diagram illustrating operation of an SCR of the second embodiment.

Referring to FIGS. 5 and 6, a second embodiment of the transfer switch system 500 according to the disclosure is a modification of the first embodiment, and differs from the first embodiment in that each of the first switch units 2, 2' further includes a switch 27, 27' that is coupled to the SCR 25, 25' in parallel. Each of the switches 27, 27' may be a metal oxide semiconductor field effect transistor (MOSFET) or an insulated gate bipolar transistor (IGBT).

In addition, each of the switches 27, 27' is operable between an ON state and an OFF state. The switch 27 is used to be controlled by the controller via a seventh control signal (S4). The switch 27' is used to be controlled by the controller via an eighth control signal (S4'). The second procedure further includes the following steps of: at the twelfth time point (t11), the switch 27' is controlled to transition from the OFF state to the ON state; and at a time point (tf) after the twelfth time point (t11) and before the thirteenth time point (t12), the switch 27' is controlled to transition from the ON state to the OFF state. The third procedure further includes the following steps of: at the eighteenth time point (t17), the switch 27 is controlled to transition from the OFF state to the ON state; and at a time point (tc) after the eighteenth time point (t17) and before the nineteenth time point (t18), the switch 27 is controlled to transition from the ON state to the OFF state.

Referring to FIGS. 5 to 8, by omitting the switch 27 as in the first embodiment, each of the SCRs 25, 45 transitions from the ON state to the OFF state at a time point (tg) which is not before the eighteenth time point (t17) and at which the current (Ip) provided by the first AC power source 200 flowing through the SCRs 25, 45 is lower in magnitude than a holding current of each of the SCRs 25, 45 that approximates zero, and the nineteenth time point (t18) should be after the time point (tg) to ensure that the load 100 will not be powered by the first and second AC power sources 200, 300 at the same time. With the switch 27 as in the second embodiment, the SCR 25 transitions from the ON state to the OFF state at the eighteenth time point (t17), the SCR 45 transitions from the ON state to the OFF state at the time point (tc) or at a time point which is not before the eighteenth time point (t17) and at which the current (Ip) that flows through the switch 27 and the SCR 45 is lower in magnitude than the holding current of the SCR 45, and the nineteenth time point (t18) should be after the time point (tc) to ensure that the load 100 will not be powered by the first and second AC power sources 200, 300 at the same time. The time point (tc) is generally before the time point (tg), and therefore the nineteenth time point (t18) may be earlier in the second embodiment than in the first embodiment, resulting in a relatively short time period from the eighteenth time period (t17) to the nineteenth time period (t18) in the second embodiment. Similarly, the thirteenth time point (t12) may be earlier in the second embodiment than in the first embodiment, resulting in a relatively short time period from the twelfth time period (t11) to the thirteenth time period (t12) in the second embodiment.

Figure 9:
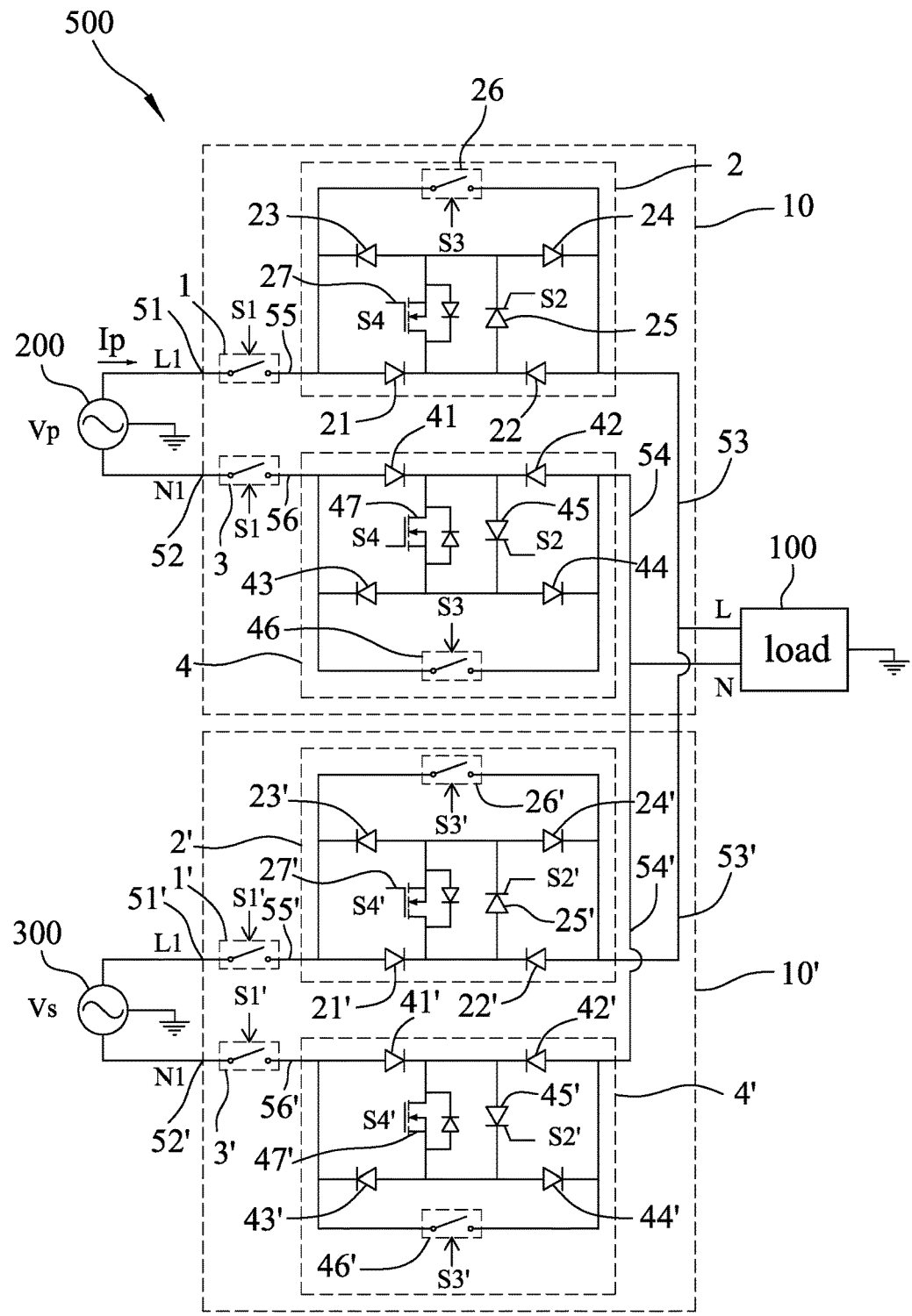
FIG. 9 is a circuit diagram illustrating a third embodiment of the transfer switch system in use with the first AC power source according to the disclosure.

Referring to FIGS. 6 and 9, a third embodiment of the transfer switch system 500 according to the disclosure is a modification of the second embodiment, and differs from the second embodiment in that each of the second switch units 4, 4' further includes a switch 47, 47' that is coupled to the SCR 45, 45' in parallel. Each of the switches 47, 47' may be a MOSFET or an IGBT.

In addition, each of the switches 47, 47' is operable between an ON state and an OFF state. The switch 47 is used to be controlled by the controller via the seventh control signal (S4). The switch 47' is used to be controlled by the controller via the eighth control signal (S4'). The second procedure further includes the following steps of: at the twelfth time point (t11), the switch 47' is controlled to transition from the OFF state to the ON state; and at the time point (tf), the switch 47' is controlled to transition from the ON state to the OFF state. The third procedure further includes the following steps of: at the eighteenth time point (t17), the switch 47 is controlled to transition from the OFF state to the ON state; and at the time point (tc), the switch 47 is controlled to transition from the ON state to the OFF state.

Referring to FIGS. 6 to 9, without the switches 27, 47 as in the first embodiment, each of the SCRs 25, 45 transitions from the ON state to the OFF state at the time point (tg), and the nineteenth time point (t18) should be after the time point (tg) to ensure that the load 100 will not be powered by the first and second AC power sources 200, 300 at the same time. With the switches 27, 47 as in the third embodiment, each of the SCRs 25, 45 transitions from the ON state to the OFF state at the eighteenth time point (t17), and the nineteenth time point (t18) should be after the time point (tc) to ensure that the load 100 will not be powered by the first and second AC power sources 200, 300 at the same time. The time point (tc) is generally before the time point (tg), and therefore the nineteenth time point (t18) may be earlier in the third embodiment than in the first embodiment, resulting in the relatively short time period from the eighteenth time period (t17) to the nineteenth time period (t18) in the third embodiment. Similarly, the thirteenth time point (t12) may be earlier in the third embodiment than in the first embodiment, resulting in the relatively short time period from the twelfth time period (t11) to the thirteenth time period (t12) in the third embodiment.

Figure 10:
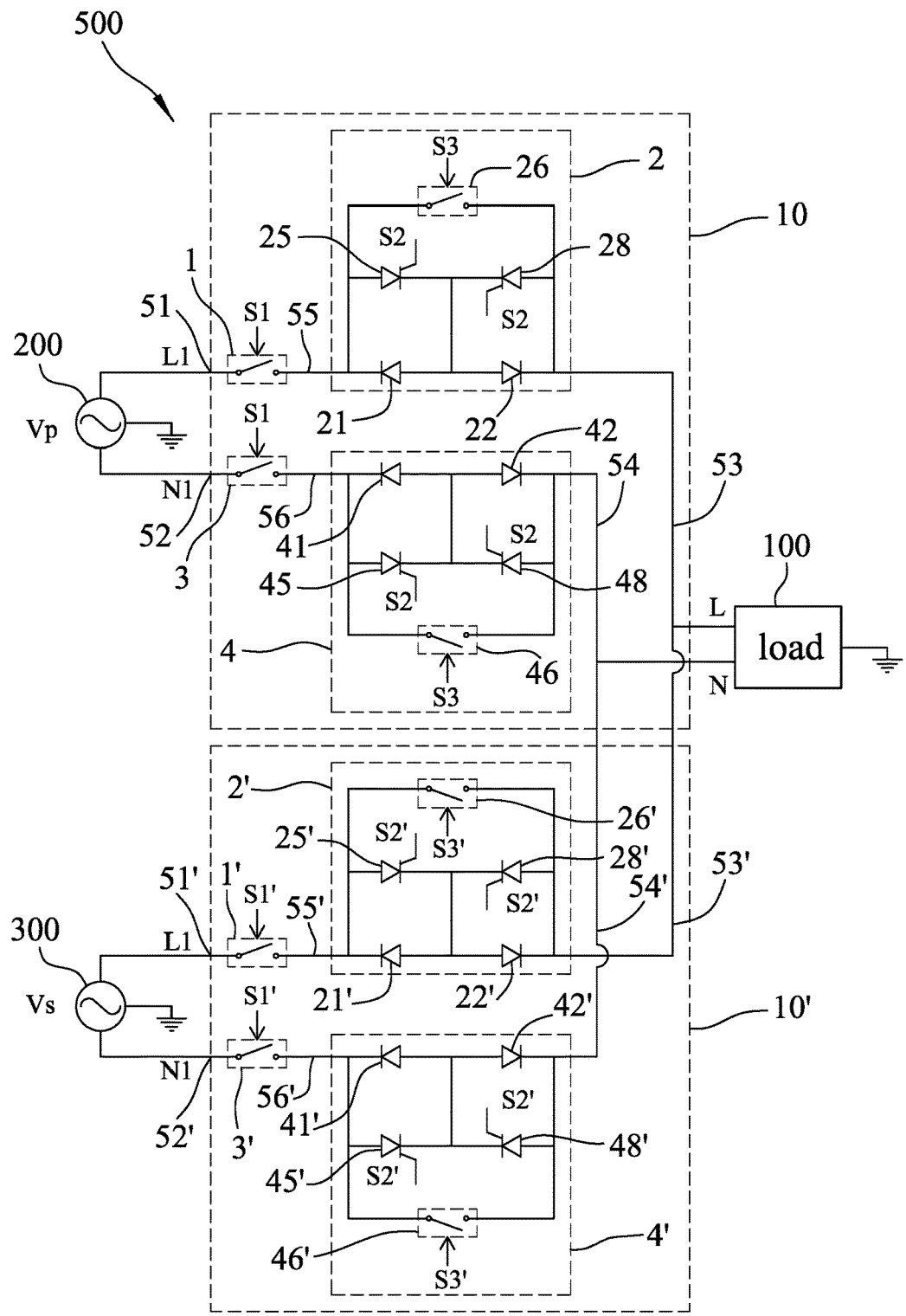
FIG. 10 is a circuit diagram illustrating a fourth embodiment of the transfer switch system in use with the first AC power source according to the disclosure.

Referring to FIGS. 4 and 10, a fourth embodiment of the transfer switch system 500 according to the disclosure is a modification of the first embodiment, and differs from the first embodiment in the first and second switch units 2, 2', 4, 4'.

It is noted that, in the fourth embodiment, the first and second switch devices 10, 10' have the same configuration, and therefore only the first switch device 10 is exemplarily described hereinafter for the sake of brevity.

In this embodiment, each of the first and second switch units 2, 4 includes two diodes 21, 22, 41, 42, two SCRs 25, 28, 45, 48 and a third relay 26, 46, where the diodes 21, 22, 41, 42 include a first diode 21, 41 and a second diode 22, 42, and where the SCRs 25, 28, 45, 48 include a first SCR 25, 45 and a second SCR 28, 48. For each of the first and second switch units 2, 4, the first diode 21, 41 has an anode, and a cathode that is coupled to the corresponding one of the first and second internal nodes 55, 56; the second diode 22, 42 has an anode that is coupled to the anode of the first diode 21, 41, and a cathode that is coupled to the corresponding one of the first and second output terminals 53, 54; the first SCR 25, 45 has an anode that is coupled to the cathode of the first diode 21, 41, and a cathode that is coupled to the anode of the first diode 21, 41; the second SCR 28, 48 has an anode that is coupled to the cathode of the second diode 22, 42, and a cathode that is coupled to the anode of the first diode 21, 41; and the third relay 26 is coupled between the cathode of the first diode 21, 41 and the cathode of the second diode 22, 42. The first SCR 25, 45, and the second diode 22, 42 cooperatively permit a current to flow therethrough from the corresponding one of the first and second internal nodes 55, 56 to the corresponding one of the first and second output terminals 53, 54 when each thereof operates in an ON state. The second SCR 28, 48 and the first diode 21, 41 cooperatively permit a current to flow therethrough from the corresponding one of the first and second output terminals 53, 54 to the corresponding one of the first and second internal nodes 55, 56 when each thereof operates in an ON state.

In addition, each of the first SCRs 25, 25', 45, 45', the second SCRs 28, 28', 48, 48' and the third relay 26, 26', 46, 46' is operable between an ON state and an OFF state. Each of the first and second SCRs 25, 28, 45, 48 is used to be controlled by the controller via the second control signal (S2). Each of the first and second SCRs 25', 28', 45', 48' is used to be controlled by the controller via the fifth control signal (S2'). Each of the third relay 26, 46 is used to be controlled by the controller via the third control signal (S3). Each of the third relay 26', 46' is used to be controlled by the controller via the sixth control signal (S3').

In view of the above, the transfer switch system 500 of this embodiment has the following advantages:

1. By virtue of the first and second diodes 21, 21', 22, 22', 41, 41', 42, 42' and the first and second SCRs 25, 25', 28, 28', 45, 45', 48, 48', the transient current induced by each of the first and second switch devices 10, 10' can be relatively small. Therefore, welding of each of the first to third relays 1, 1', 3, 3', 26, 26', 46, 46' due to the corresponding transient current can be prevented, resulting in relatively high reliability of each of the first and second switch devices 10, 10'.

2. By virtue of the third relays 26, 26', 46, 46', the power loss of each of the first and second switch devices 10, 10' can be relatively small. Therefore, each of the first and second switch devices 10, 10' has relatively high power efficiency, and a cooling fan may not be required.

It is noted that, in other embodiments, the first and second switch devices 10, 10' may have different configurations, and the first and second switch units 2, 2', 4, 4' of each of the first and second switch devices 10, 10' may have different configurations.

In the description above, for the purposes of explanation, numerous specific details have been set forth in order to provide a thorough understanding of the embodiment(s). It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects.

While the disclosure has been described in connect ion with what is (are) considered the exemplary embodiment(s), it is understood that the disclosure is not limited to the disclosed embodiment(s) but is intended to cover various arrangements included within the spirit and scope of the broadest interpretation so as to encompass all such modifications and equivalent arrangements.

What is claimed is:

1. A switch device comprising:
   a first input terminal;
   a second input terminal;
   a first output terminal;
   a second output terminal;
   a first switch unit that is coupled between said first input terminal and said first output terminal;
   a second switch unit that is coupled between said second input terminal and said second output terminal;
   a first relay that is coupled between said first input terminal and said first switch unit; and
   a second relay that is coupled between said second input terminal and said second switch unit;
   each of said first and second switch units including a plurality of diodes and at least one semiconductor-controlled rectifier (SCR), where at least one of said diodes and one of said at least one SCR cooperatively permit a current to flow therethrough from a corresponding one of said first and second input terminals to the corresponding one of said first and second output terminals when each thereof operates in an ON state, and where at least one of said diodes and one of said at least one SCR cooperatively permit a current to flow therethrough from a corresponding one of said first and second output terminals to the corresponding one of said first and second input terminals when each thereof operates in an ON state; and
   each of said first and second switch units further including a third relay that is coupled between a corresponding one of said first and second relays and the corresponding one of said first and second output terminals, and said third relay is actuated by a control signal to turn ON subsequent to said SCR turning ON and to remain ON subsequent to said SCR turning OFF when an alternating current (AC) voltage input across said first and second input terminals has an amplitude which equals a predetermined value greater than zero.

2. The switch device of claim 1, wherein said at least one SCR of said first switch unit includes a first SCR, and said first switch unit further includes a switch that is coupled to said first SCR in parallel.

3. The switch device of claim 2, wherein said at least one SCR of said second switch unit includes a second SCR, and said second switch unit further includes a switch that is coupled to said second SCR in parallel.

4. The switch device of claim 2, wherein said switch is one of a metal oxide semiconductor field effect transistor and an insulated gate bipolar transistor.

5. The switch device of claim 1, wherein:
said at least one SCR of said first switch unit includes a first SCR;
said diodes of said first switch unit includes:
a first diode having an anode that is coupled to said first input terminal, and a cathode,
a second diode having an anode that is coupled to said first output terminal, and a cathode that is coupled to said cathode of said first diode,
a third diode having an anode, and a cathode that is coupled to said anode of said first diode, and
a fourth diode having an anode that is coupled to said anode of said third diode, and a cathode that is coupled to said anode of said second diode; and
said first SCR has an anode that is coupled to said cathode of said first diode, and a cathode that is coupled to said anode of said third diode.

6. The switch device of claim 1, wherein:
said at least one SCR of said first switch unit includes a first SCR and a second SCR;
said diodes of said first switch unit includes:
a first diode having an anode, and a cathode that is coupled to said first input terminal, and
a second diode having an anode that is coupled to said anode of said first diode, and a cathode that is coupled to said first output terminal;
said first SCR has an anode that is coupled to said cathode of said first diode, and a cathode that is coupled to said anode of said first diode; and
said second SCR has an anode that is coupled to said cathode of said second diode, and a cathode that is coupled to said anode of said first diode.

7. A control method for controlling a switch device, the switch device including:
a first input terminal;
a second input terminal;
a first output terminal;
a second output terminal;
a first switch unit coupled between said first input terminal and said first output terminal;
a second switch unit coupled between said second input terminal and said second output terminal;
each of said first and second switch units including a plurality of diodes and at least one semiconductor-controlled rectifier (SCR), wherein at least one of said diodes and one of said at least one SCR cooperatively permit a current to flow therethrough from a corresponding one of said first and second input terminals to the corresponding one of said first and second output terminals when each thereof operates in an ON state, and wherein at least one of said diodes and one of said at least one SCR cooperatively permit a current to flow therethrough from a corresponding one of said first and second output terminals to the corresponding one of said first and second input terminals when each thereof operates in an ON state; and
a first relay coupled between said first input terminal and said first switch unit, a second relay coupled between said second input terminal and said second switch unit, and each of said first and second switch units including
a third relay coupled between a corresponding one of said first and second relays and the corresponding one of said first and second output terminals;
the first and second input terminals of the switch device being coupled to an alternating current (AC) power source for receiving an AC voltage therefrom;
said control method comprising:
a first procedure that is performed when the AC voltage has an amplitude which equals a predetermined value greater than zero, and that includes:
at a first time point, controlling each of the first and second relays to transition from an OFF state to an ON state;
at a second time point after the first time point, controlling the at least one SCR of each of the first and second switch units to be operable between an ON state and an OFF state based on a voltage thereacross;
at a third time point after the second time point, controlling the third relay of each of the first and second switch units to transition from an OFF state to an ON state; and
at a fourth time point after the third time point, controlling the at least one SCR of each of the first and second switch units to disable transitioning of the at least one SCR from the OFF state to the ON state.

8. The control method of claim 7, further comprising a second procedure that is performed when the amplitude of the AC voltage equals zero, and that includes:
controlling each of the first, second and third relays to transition from the ON state to the OFF state.

9. The control method of claim 7, further comprising a second procedure that is performed when the amplitude of the AC voltage is greater than zero and less than the predetermined value, and that includes:
at a fifth time point, controlling the at least one SCR of each of the first and second switch units to be operable between the ON state and the OFF state based on the voltage thereacross;
at a sixth time point after the fifth time point, controlling the third relay of each of the first and second switch units to transition from the ON state to the OFF state;
at a seventh time point after the sixth time point, controlling the at least one SCR of each of the first and second switch units to disable transitioning of the at least one SCR from the OFF state to the ON state; and
at an eighth time point after the seventh time point, controlling each of the first and second relays to transition from the ON state to the OFF state.

10. The control method of claim 9, the at least one SCR of the first switch unit including a first SCR, the first switch unit further including a switch that is coupled to the first SCR in parallel, wherein said second procedure further includes:
at the seventh time point, controlling the switch to transition from an OFF state to an ON state; and
at a time point after the seventh time point and before the eighth time point, controlling the switch to transition from the ON state to the OFF state.

11. The control method of claim 9, the at least one SCR of each of the first and second switch units including a first SCR, each of the first and second switch units further including a switch that is coupled to the first SCR in parallel, wherein said second procedure further includes:
at the seventh time point, controlling the switch of each of the first and second switch units to transition from an OFF state to an ON state; and at a time point after the seventh time point and before the eighth time point, controlling the switch of each of the first and second switch units to transition from the ON state to the OFF state.

12. A control method for controlling a transfer switch system that includes a first switch device and a second switch device, each of the first and second switch devices including:
   a first input terminal;
   a second input terminal;
   a first output terminal;
   a second output terminal;
   a first switch unit coupled between said first input terminal and said first output terminal;
   a second switch unit coupled between said second input terminal and said second output terminal;
   each of said first and second switch units including a plurality of diodes and at least one semiconductor-controlled rectifier (SCR), wherein at least one of said diodes and one of said at least one SCR cooperatively permit a current to flow therethrough from a corresponding one of said first and second input terminals to the corresponding one of said first and second output terminals when each thereof operates in an ON state, and wherein at least one of said diodes and one of said at least one SCR cooperatively permit a current to flow therethrough from a corresponding one of said first and second output terminals to the corresponding one of said first and second input terminals when each thereof operates in an ON state; and
   a first relay coupled between said first input terminal and said first switch unit, a second relay coupled between said second input terminal and said second switch unit, and each of said first and second switch units including a third relay coupled between a corresponding one of said first and second relays and the corresponding one of said first and second output terminals;
   the first and second input terminals of the first switch device being coupled to a first alternating current (AC) power source for receiving a first AC voltage therefrom, the first and second input terminals of the second switch device being coupled to a second AC power source for receiving a second AC voltage therefrom, the first and second output terminals of the second switch device being coupled respectively to the first and second output terminals of the first switch device;
   said control method comprising:
   a first procedure that is performed when the first AC voltage has an amplitude which equals a predetermined value greater than zero, and that includes:
   at a first time point, controlling each of the first and second relays of the first switch device to transition from an OFF state to an ON state;
   at a second time point after the first time point, controlling the at least one SCR of each of the first and second switch units of the second switch device to be operable between an ON state and an OFF state based on a voltage thereacross;
   at a third time point after the second time point, controlling the third relay of each of the first and second switch units of the second switch device to transition from an ON state to an OFF state;
   at a fourth time point after the third time point, controlling the at least one SCR of each of the first and second switch units of the second switch device to disable transitioning the at least one SCR from the OFF state to the ON state;
   at a fifth time point after the fourth time point, controlling the at least one SCR of each of the first and second switch units of the first switch device to be operable between an ON state and an OFF state based on a voltage thereacross;
   at a sixth time point after the fifth time point, controlling the third relay of each of the first and second switch units of the first switch device to transition from an OFF state to an ON state; and
   at a seventh time point after the sixth time point, controlling the at least one SCR of each of the first and second switch units of the first switch device to disable transitioning of the at least one SCR from the OFF state to the ON state.

13. The control method of claim 12, further comprising a second procedure that is performed when the amplitude of the first AC voltage equals zero, and that includes:
   controlling each of the first, second and third relays of the first switch device to transition from the ON state to the OFF state;
   at an eighth time point after controlling each of the first, second and third relays of the first switch device to transition from the ON state to the OFF state, controlling the at least one SCR of each of the first and second switch units of the second switch device to be operable between the ON state and the OFF state based on the voltage thereacross;
   at a ninth time point after the eighth time point, controlling the third relay of each of the first and second switch units of the second switch device to transition from the OFF state to the ON state; and
   at a tenth time point after the ninth time point, controlling the at least one SCR of each of the first and second switch units of the second switch device to disable transitioning of the at least one SCR from the OFF state to the ON state.

14. The control method of claim 12, further comprising a second procedure that is performed when the amplitude of the first AC voltage is greater than zero and less than the predetermined value, and that includes:
   at an eighth time point, controlling the at least one SCR of each of the first and second switch units of the first switch device to be operable between the ON state and the OFF state based on the voltage thereacross;
   at a ninth time point after the eighth time point, controlling the third relay of each of the first and second switch units of the first switch device to transition from the ON state to the OFF state;
   at a tenth time point after the ninth time point, controlling the at least one SCR of each of the first and second switch units of the first switch device to disable transitioning of the at least one SCR from the OFF state to the ON state;
   at an eleventh time point after the tenth time point, controlling each of the first and second relays of the first switch device to transition from the ON state to the OFF state;
   at a twelfth time point after the eleventh time point, controlling the at least one SCR of each of the first and second switch units of the second switch device to be operable between the ON state and the OFF state based on the voltage thereacross;
   at a thirteenth time point after the twelfth time point, controlling the third relay of each of the first and second switch units of the second switch device to transition from the OFF state to the ON state; and at a fourteenth time point after the thirteenth time point, controlling the at least one SCR of each of the first and second switch units of the second switch device to disable transitioning of the at least one SCR from the OFF state to the ON state.

15. The control method of claim 14, the at least one SCR of the first switch unit of each of the first and second switch devices including a first SCR, the first switch unit of each of the first and second switch devices further including a switch that is coupled to the first SCR in parallel, wherein said first procedure further includes:
at the fourth time point, controlling the switch of the first switch unit of the second switch device to transition from an OFF state to an ON state; and
at a time point after the fourth time point and before the fifth time point, controlling the switch of the first switch unit of the second switch device to transition from the ON state to the OFF state; and wherein said second procedure further includes:
at the tenth time point, controlling the switch of the first switch unit of the first switch device to transition from an OFF state to an ON state; and
at a time point after the tenth time point and before the eleventh time point, controlling the switch of the first switch unit of the first switch device to transition from the ON state to the OFF state.

16. The control method of claim 14, the at least one SCR of each of the first and second switch units of the first and second switch devices including a first SCR, each of the first and second switch units of the first and second switch devices further including a switch that is coupled to the first SCR in parallel, wherein said first procedure further includes:
at the fourth time point, controlling the switch of each of the first and second switch units of the second switch device to transition from an OFF state to an ON state; and
at a time point after the fourth time point and before the fifth time point, controlling the switch of each of the first and second switch units of the second switch device to transition from the ON state to the OFF state; and wherein said second procedure further includes:
at the tenth time point, controlling the switch of each of the first and second switch units of the first switch device to transition from an OFF state to an ON state; and
at a time point after the tenth time point and before the eleventh time point, controlling the switch of each of the first and second switch units of the first switch device to transition from the ON state to the OFF state.

* * * * *